(12) United States Patent
Dotta

(10) Patent No.: US 7,442,642 B2
(45) Date of Patent: Oct. 28, 2008

(54) METHOD OF FORMING ELECTRODE FOR SEMICONDUCTOR DEVICE

(75) Inventor: Yoshihisa Dotta, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 200 days.

(21) Appl. No.: 11/227,103

(22) Filed: Sep. 16, 2005

(65) Prior Publication Data

US 2006/0068580 A1    Mar. 30, 2006

(30) Foreign Application Priority Data

Sep. 28, 2004   (JP)   ............... 2004-282699

(51) Int. Cl.
*H01L 21/60* (2006.01)
(52) U.S. Cl. .............. 438/667; 257/E23.011; 257/E21.596
(58) Field of Classification Search ........... 438/667; 257/E23.011, E21.596
See application file for complete search history.

(56) References Cited

U.S. PATENT DOCUMENTS

| 6,856,023 | B2 | 2/2005 | Muta et al. | |
|---|---|---|---|---|
| 2002/0124398 | A1* | 9/2002 | Sturni et al. | 29/832 |
| 2003/0151144 | A1 | 8/2003 | Muta et al. | |
| 2004/0087126 | A1 | 5/2004 | Fartash | |
| 2005/0003649 | A1* | 1/2005 | Takao | 438/612 |
| 2005/0067713 | A1 | 3/2005 | Mutta et al. | |
| 2005/0221601 | A1* | 10/2005 | Kawano | 438/622 |
| 2006/0024966 | A1 | 2/2006 | Umemoto et al. | |

FOREIGN PATENT DOCUMENTS

| JP | 3186941 | 5/2001 |
|---|---|---|
| JP | 2001-351997 | 12/2001 |
| JP | 2003-289073 | 10/2003 |
| JP | 2003-309221 | 10/2003 |

OTHER PUBLICATIONS

JP2006-32695 corresponds to US 2006/0024966 listed above.
JP2004-153269 corresponds to US 2004/0087126 listed above.

* cited by examiner

*Primary Examiner*—George Fourson
(74) *Attorney, Agent, or Firm*—Nixon & Vanderhye P.C.

(57) ABSTRACT

The semiconductor device of the present invention and the method of the present invention, for forming the semiconductor device, form: a penetrating hole in a semiconductor wafer which has a first insulating film and an electrode pad formed on a first face of the semiconductor wafer, the penetrating hole being immediately below the electrode pad; and a second insulating film on an inner wall of the penetrating hole and on a second face of the semiconductor wafer. In forming the second insulating film, electrodeposition using the semiconductor wafer as a cathode is used. After the second insulating film is formed, the first insulating film is etched using the second insulating film as a mask, the back face of the electrode pad is exposed, and a conductor layer, acting as a penetrating electrode, is formed in the penetrating hole.

3 Claims, 9 Drawing Sheets

METHOD OF FORMING ELECTRODE FOR SEMICONDUCTOR DEVICE

This non-provisional application claims priority under 35 U.S.C. § 119(a) on Patent Application No. 2004/282699 filed in Japan on Sep. 28, 2004, the entire contents of which are hereby incorporated by reference.

FIELD OF THE INVENTION

The present invention relates to a semiconductor device and a fabrication method thereof, and particularly to a semiconductor device and fabrication method thereof which include a Si hole forming process for forming a penetrating electrode.

BACKGROUND OF THE INVENTION

Recently, there have been increasing needs for downsizing and thinning of semiconductor devices. Further, a method for increasing packaging density by laminating a plurality of semiconductors has been widely used. As a method for responding to such needs, a technique for forming a penetrating electrode which penetrates a semiconductor wafer from an electrode pad formed on a front face of a semiconductor device and connected to a back face of the semiconductor device is noted.

For example, Japanese Patent Publication 3186941 (publication date: Aug. 20, 1996) discloses a technique for forming a penetrating hole which penetrates a semiconductor substrate from a back face to an electrode formed on a front face, covering an inner wall of the penetrating hole with an insulating film, and then filling the inside of the penetrating hole with metal, so as to form a penetrating electrode. The penetrating electrode forms a bump which protrudes on the back face of the semiconductor substrate. Further, the Japanese Patent No. 3186941 also discloses a multi-chip module which realizes high density by laminating a plurality of semiconductor chips which include thus fabricated penetrating electrodes.

Further, Japanese Laid-Open Patent Publication 2003/309221 (publication date: Oct. 31, 2003) discloses a method for fabricating a BGA (Ball Grid Array) semiconductor device with a penetrating electrode. Further, Japanese Laid-Open Patent Publication 2003/309221 discloses a technique for forming a penetrating hole which penetrates a semiconductor substrate from a back face to an electrode formed on a front face, forming an oxide film on an inner wall of the penetrating hole and on a back face of the electrode using CVD, and then etching, by anisotropic etching, only an oxide film attached to the back face of the electrode, so that an oxide film on a side wall remains. After that, a metallic layer is formed inside the hole, and thereby a penetrating electrode which connects the front face and back face of the semiconductor substrate is formed.

Further, recently, there has been an increasing need for downsizing and thinning of small camera modules, represented by mobile phones. For example, Japanese Laid-Open Patent Publication 2001/351997 (publication date: Dec. 21, 2001) discloses a packaging structure of a small solid-state image sensor (a light receiving sensor) having a penetrating hole.

The first point of the technique disclosed in Japanese Laid-Open Patent Publication 2001/351997 is such that an electrode for input/output to and from the outside, on a face for forming a light receiving sensor, is taken out to a back face using a penetrating electrode which penetrates a Si substrate. As a result, wire bonding or the like which was necessary in conventional techniques becomes unnecessary, and accordingly a packaging area can be made as small as a semiconductor chip size and downsizing can be realized.

The second point of Japanese Laid-Open Patent Publication 2001/351997 is that by forming a light transmitting protective part on a light receiving sensor, it is possible to prevent foreign matter, such as dirt, from attaching on the light receiving sensor in and after this process. As such, it is possible to carry out processes in an environment with low cleanness, after the light transmitting protective part is formed.

In this way, a process for forming a penetrating electrode is noted for realizing downsizing and thinning of not only memories but also a variety of devices such as image sensors.

However, conventional techniques for forming a penetrating electrode, as described above, have the following problem. In order to explain this problem, first, an example of a structure of a semiconductor device provided with a penetrating electrode is illustrated in FIG. 9.

FIG. 9 is a cross sectional structure view illustrating the surroundings of an electrode section of a semiconductor device having a penetrating electrode. Generally, a first insulating film 102 is formed on a first face (corresponding to a front face of a substrate) of a semiconductor wafer 101, and a metallic wire layer having a multi-layered structure is formed on the first insulating film 102. An electrode pad 103 for performing signal input/output of a semiconductor chip is formed on the metallic wire layer, and the penetrating electrode is formed in a region of the electrode pad 103. Further, a protective film 104 made of an oxide film or a nitride film is formed on the metallic wire layer.

In the semiconductor wafer 101, a penetrating hole is formed immediately below the electrode pad 103, and a second insulating film 105 is formed so as to cover an inner wall of the penetrating hole and a second face (corresponding to a back face of the substrate) of the semiconductor wafer 101. Further, a conductor layer 106 is formed from the inner wall of the penetrating hole to the second face of the semiconductor wafer 101, and the conductor layer 106 on the inner wall of the penetrating hole serves as the penetrating electrode. The conductor layer 106 on the second face of the semiconductor wafer 101 is connected with an external input/output terminal 107, and on the second face of the semiconductor wafer 101, by use of an insulating film 108, only the external input/output terminal 107 is exposed. As such, the electrode pad 103 on the first face of the semiconductor wafer 101 and the external input/output terminal 107 on the second face of the semiconductor wafer 101 are in communication with each other via the conductor layer 106.

In forming the semiconductor device with a structure illustrated in FIG. 9, the second insulating film 105 is formed on the semiconductor wafer 101, from the second face side, by using CVD (Chemical Vapor Deposition). At this time, the first insulating film 102, the electrode pad 103, and the protective film 104 have already been formed on the semiconductor wafer 101.

However, in this case, as illustrated in FIG. 10(a), the second insulating film 105 is formed on a back face of the electrode pad 103 which is to communicate via the penetrating electrode. Therefore, there is a need to remove the second insulating film 105 formed on the back face of the electrode pad 103 and to leave the second insulating film 105 formed on the inner wall of the penetrating hole, as illustrated in FIG. 10(b). Here, there are several methods for removing the second insulating film 105 formed on the back face of the electrode pad 103.

A first method is painting resist on the back face of the semiconductor wafer, opening the resist on the inner side of the penetrating hole by use of a photo process, and removing the insulating film on the back face of the electrode pad using dry etching.

A second method is etching only the insulating film of the back face of the electrode, by anisotropic etching, without etching the insulating film on the sidewall of the penetrating hole. Japanese Patent Publication 3186941 and Japanese Laid-Open Patent Publication 2001/351997 use the second method.

However, in the first method, when resist is evenly painted on a back face of a semiconductor wafer having a penetrating hole, it is difficult to evenly fill resist into the penetrating hole. Particularly, the more minute the penetrating electrode becomes, the more difficult it becomes to fill resist into the penetrating hole and open the resist in the penetrating hole by development.

Generally, a size of an electrode of a semiconductor device is not more than about 100 μm square for the most part. Thicknesses of semiconductor wafers vary, but are usually about 100 through 700 μm. For example, when a penetrating hole whose size is 70 μm square is formed in a semiconductor wafer whose thickness is 100 μm, it is difficult to evenly paint resist in the inside of this minute hole. The difficulty further increases when an electrode is a smaller hole, whose diameter is 10 μm and whose depth is approximately 50 μm.

Further, even when it is possible to evenly fill the resist in the inside of the minute penetrating hole, it is difficult for developer to circulate in a hole with this aspect ratio. As such, it is difficult to open the resist by development.

Further, when the second method is used, it is thought that an opening can be easily made in an insulating film on a back face of an electrode pad, compared with the first method.

However, when the second insulating film is formed by forming an oxide film inside the penetrating hole using CVD, a thickness of the insulating film on the inner wall of the penetrating hole becomes thinner than that of the insulating film on the back face of the semiconductor wafer. Further, when the insulating film on the back face of the electrode pad is etched using anisotropic etching, an etching rate of the insulating film on the back face of the semiconductor wafer is faster than that of the insulating film on the back face of the electrode pad at the bottom of the hole, and accordingly the insulating film on the back face of the semiconductor wafer is also etched. Further, even though anisotropic etching is used, it is inevitable that the insulating film on the inner wall of the penetrating hole is reduced by etching.

Therefore, it is necessary to form in advance a thick insulating film on the back face of the semiconductor wafer or to reform the insulating film on the semiconductor wafer after the insulating film on the back face of the electrode pad is removed by etching. This leads to the disadvantage of increased fabrication cost.

SUMMARY OF THE INVENTION

The object of the present invention is to form, with ease and at low cost, a penetrating electrode with high reliability.

In order to solve the problem, the method according to the present invention for forming a semiconductor device including: an electrode pad formed on a first face of a semiconductor substrate via a first insulating film; and a penetrating electrode which connects the electrode pad and an external connection terminal on a second face of the semiconductor substrate, the method comprising: a first step of forming a penetrating hole in the semiconductor substrate which has the first insulating film and the electrode pad formed on the first face thereof, the penetrating hole being immediately below the electrode pad; a second step of forming a second insulating film on an inner wall of the penetrating hole formed in the semiconductor substrate and on the second face of the semiconductor substrate, by use of electrodeposition using the semiconductor substrate as a cathode; a third step of etching the first insulating film, using the second insulating film as a mask, so as to expose a back face of the electrode pad to a second face side of the semiconductor substrate; and a fourth step of forming a conductor layer provided as the penetrating electrode in the penetrating hole.

Here, in forming the penetrating electrode which connects the electrode pad formed on the first face of the semiconductor substrate and the external connection terminal on the second face of the semiconductor substrate, in order to insulate the semiconductor substrate from the penetrating electrode, it is necessary to form the insulating film (second insulating film) on the inner wall of the penetrating hole formed in the semiconductor substrate.

In conventional cases, film-forming techniques such as sputtering and CVD have been used for forming the second insulating film. However, these techniques also form the second insulating film on the back face of the electrode pad. Therefore, in order to obtain conduction between the electrode pad and the penetrating electrode, it is necessary to remove the second insulating film formed on the back face of the electrode pad. However, when the penetrating hole is minute, it is very difficult to remove the second insulating film formed on the back face of the electrode pad.

On the other hand, with the structure of the present invention, in forming the second insulating film, electrodeposition using the semiconductor substrate as a cathode is used. As a result, the second insulating film is formed only on the surface of the semiconductor substrate (namely, on the inner wall of the penetrating hole formed in the semiconductor substrate, and on the second face of the semiconductor substrate), and is not formed on the back face of the electrode pad. Therefore, it is unnecessary to remove the second insulating film formed on the back face of the electrode pad, and accordingly it is possible to form the penetrating electrode with high reliability and to reduce manufacturing costs.

Further, it is preferable that in the method for forming a semiconductor device, in the first step, a reinforcing plate for preventing breakage of the semiconductor substrate is affixed to the first face of the semiconductor substrate via an adhesive layer.

With this arrangement, by affixing the reinforcing plate to the semiconductor substrate, it becomes easy to use the semiconductor substrate whose thickness is reduced by polishing or the like. When the thickness of the semiconductor substrate is thick, it takes more time to etch in forming the penetrating hole in the semiconductor substrate, and accordingly the cost increases or control of the shape of the hole becomes difficult. However, making the thickness of the semiconductor substrate thin, this disadvantage can be avoided.

Further, it is preferable that in the method for forming a semiconductor device, in the second step, a material for electrodeposition is polymide or epoxy.

Further, it is preferable that in the method for forming a semiconductor device, the first insulating film formed on the first face of the semiconductor substrate is an oxide film.

In order to solve the problem, the semiconductor device according to the present invention comprises: an electrode pad formed on a first face of a semiconductor substrate via a first insulating film; and a penetrating electrode which connects the electrode pad and an external connection terminal on a second face of the semiconductor substrate, wherein a penetrating hole is formed in the semiconductor substrate which has the first insulating film and the electrode pad formed on the first face thereof, the penetrating hole being immediately below the electrode pad, a second insulating film is formed on an inner wall of the penetrating hole and on the second face of the semiconductor substrate, and the first insulating film immediately below the electrode pad is opened so as to expose a back face of the electrode pad to a second face side of the semiconductor substrate, and a side face of an open part of the first insulating film is exposed at the inner wall of the penetrating hole.

With this arrangement, it is possible to produce a semiconductor by the above forming method. Namely, by forming the second insulating film through electrodeposition, the second insulating film is formed only on the inner wall of the penetrating hole formed in the semiconductor substrate and on the second face of the semiconductor substrate, and the first insulating film immediately below the electrode pad is opened by etching using the second insulating film as a mask, and accordingly the side face of the open part of the first insulating film is exposed at the inner wall of the penetrating hole.

Further, with this arrangement, in the semiconductor device, the side etching of the first insulating film rarely occurs during etching to open the first insulating film, and accordingly leakage or defective coverage can be suppressed.

Further, in forming the penetrating hole in the semiconductor substrate through etching or the like, a phenomenon occurs in which the etching reaches the first insulating film and then the etching proceeds in a lateral direction, with a result that a notch is generated. With the conventional structure, in which the whole inner wall of the penetrating hole is insulated by the second insulating film, the second insulating film is not sufficiently formed in the notch part, and accordingly leakage may occur.

On the other hand, with the structure of the present invention, even when a notch is generated, the exposed face of the first insulating film and the exposed face of the second insulating film contact with each other at the notch part of the inner wall of the penetrating hole, and the contact part is satisfactorily insulated, so that there is no possibility of leakage.

Further, it is preferable that in the semiconductor device, a reinforcing plate for preventing breakage of the semiconductor substrate is affixed to the first face of the semiconductor substrate via an adhesive layer.

Further, the semiconductor device may be arranged so as to be a solid-state image sensor, wherein the reinforcing plate is made of a light transmitting material and a CCD sensor is disposed between the semiconductor substrate and the reinforcing plate.

For a fuller understanding of the nature and advantages of the invention, reference should be made to the ensuing detailed description taken in conjunction with the accompanying drawings.

DESCRIPTION OF THE EMBODIMENTS

One embodiment of the present invention is explained below with reference to FIGS. 1 through 8(b). First, in the semiconductor device according to the present invention, a cross sectional structure of the surroundings of an electrode section of a semiconductor device having a penetrating electrode is illustrated in FIG. 1.

Figure 1:
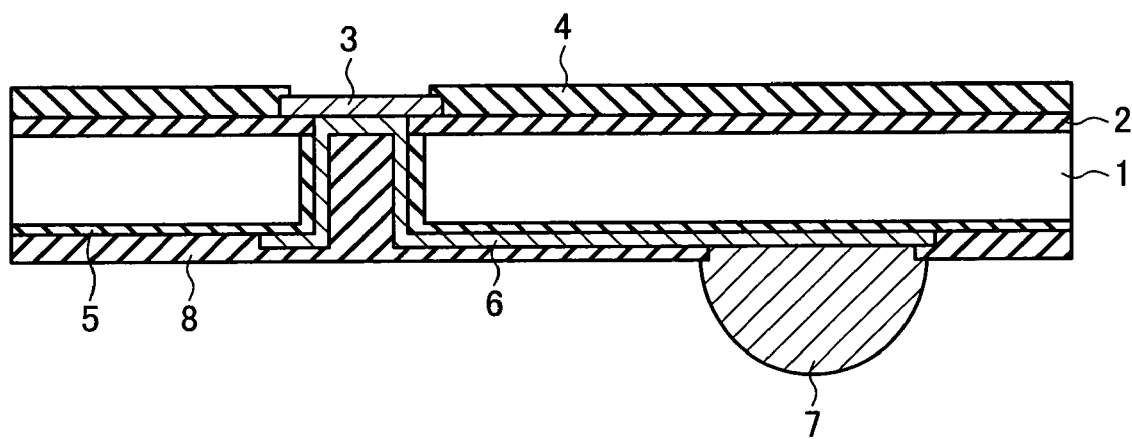
FIG. 1 is a cross sectional view illustrating a main structure of a semiconductor device according to an embodiment of the present invention.
Figure 2:
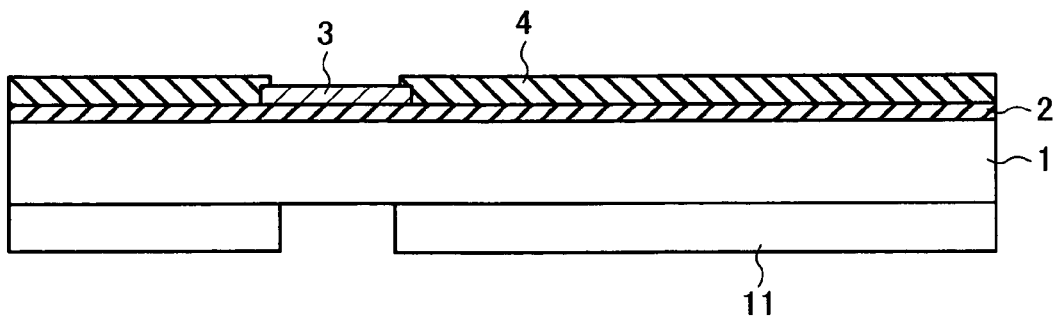
FIGS. 2(a) through 2(c) are cross sectional views illustrating a part of a process for fabricating the semiconductor device.
Figure 2:
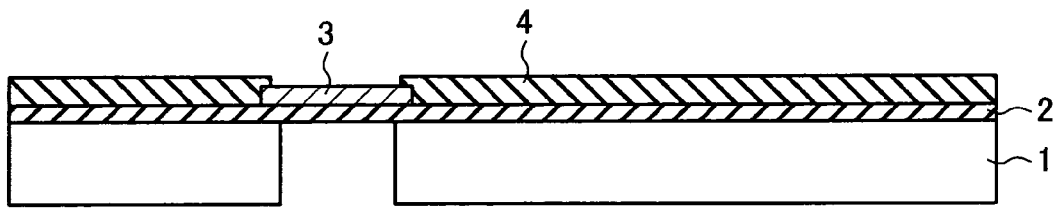
Figure 2:
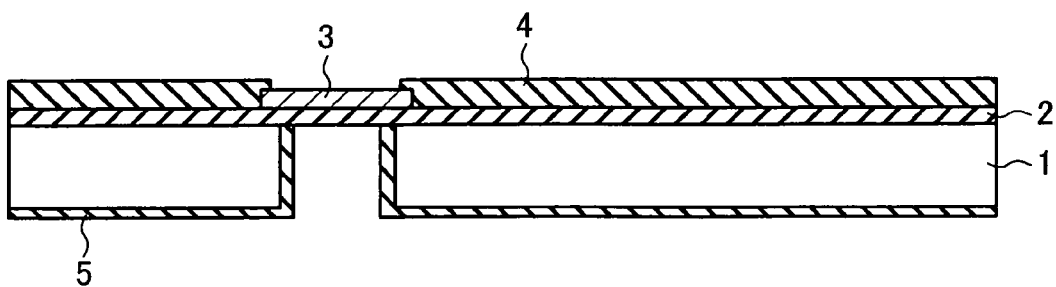
Figure 3:
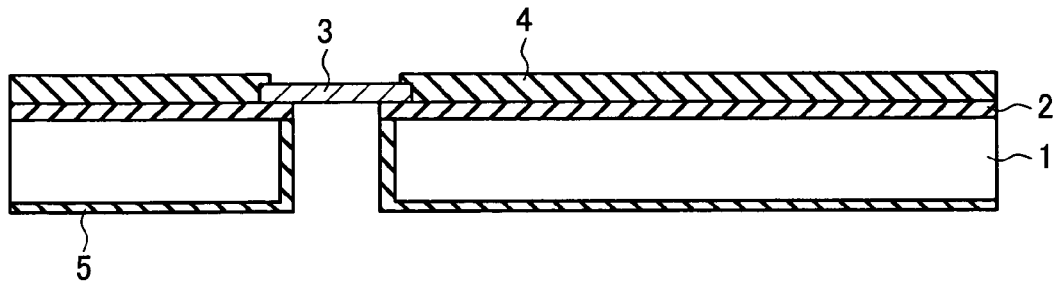
FIGS. 3(a) through 3(c) are cross sectional views illustrating a part of a process for fabricating the semiconductor device.
Figure 3:
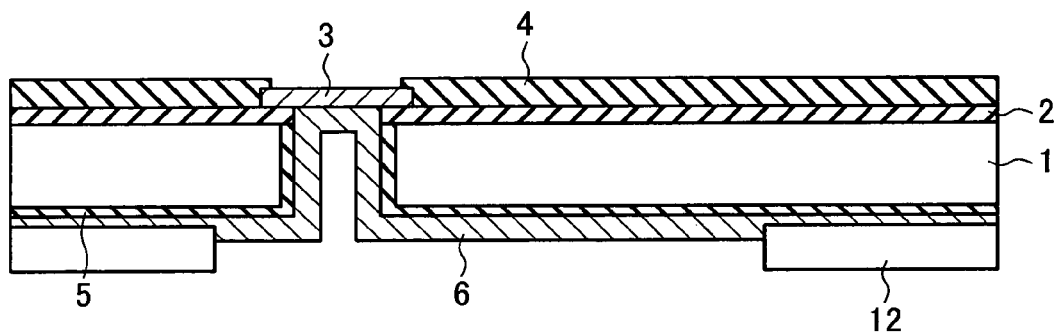
Figure 3:
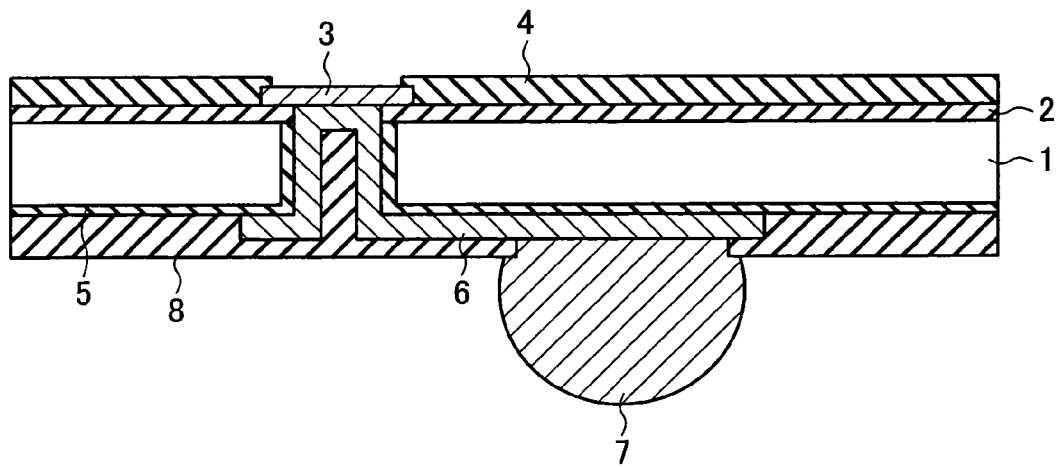

In the semiconductor device illustrated in FIG. 1, a metallic wire layer having a single-layered or multi-layered structure is formed on a first face (corresponding to a front face of a substrate) of a semiconductor wafer (e.g. a Si wafer) 1, with a first insulating film 2 formed between the first face of the semiconductor wafer 1 and the metallic wire layer. A semiconductor element (not shown) is connected with a predetermined terminal on the metallic wire layer, and an electrode pad 3 for performing signal input/output with the semiconductor element is formed. FIG. 1 shows only the electrode pad 3 out of the metallic wire layer. Further, a protective film 4 made of an oxide film or a nitride film is formed on the metallic wire layer. Note that a semiconductor substrate other than Si, such as GaAs, also can be used as the semiconductor wafer 1. Further, an example of the first insulating film 2 is an oxide film such as a Si oxide film.

In the semiconductor device, the penetrating electrode is formed in a region of the electrode pad 3. Therefore, in the semiconductor wafer 1, a penetrating hole is formed immediately below the electrode pad 3, and a second insulating film 5 is formed so as to cover the inner wall of the penetrating hole and the second face (corresponding to the back face of the substrate) of the semiconductor wafer 1. Further, a conductor layer 6 is formed from the inner wall of the penetrating hole to the second face of the semiconductor wafer 1, and the conductor layer 6 has the function of the penetrating electrode. At that time, the electrode pad 3 and the conductor layer 6 are insulated from the semiconductor wafer 1 by the first insulating film 2 and the second insulating film 5.

The conductor layer 6 on the second face of the semiconductor wafer 1 is connected with an external input/output terminal 7, and the second face of the semiconductor wafer 1 is covered with a protective film 8 except an opening for the external input/output terminal 7. As a result, the electrode pad 3 on the first face of the semiconductor wafer 1 is connected with the external input/output terminal 7 on the second face via the conductor layer 6.

In the semiconductor device illustrated in FIG. 1, a process for forming the penetrating electrode is explained below with reference to FIGS. 2(a) through 2(c) and FIGS. 3(a) through 3(c).

FIG. 2(a) is a view illustrating a cross sectional structure of the surroundings of the electrode pad 3 of the semiconductor wafer 1. The figure illustrates a state in which the first insulating film 2, a metallic wire layer including the electrode pad 3, and the protective film 4 are formed.

In the state illustrated in FIG. 2(a), the semiconductor wafer 1 is polished by back face polishing so as to be 300 μm in thickness. This is because in forming a penetrating hole in the semiconductor wafer 1 in a later step, the thicker the semiconductor wafer 1 is (the deeper the penetrating hole is), the longer it takes to etch, which increases the costs, or the more difficult it becomes to control the shape of the hole. That is, by making the semiconductor wafer 1 thinner, to some extent, the required depth of etching becomes more shallow. On the other hand, by making the semiconductor wafer 1 too thin, it becomes difficult to handle the semiconductor wafer 1 and accordingly a possibility of breakage increases, or the semiconductor wafer 1 may be bent. As such, in the present embodiment, the thickness of the semiconductor wafer 1 is set to 300 μm.

Next, resist 11 is painted on the back face (polished face) of the semiconductor wafer 1, and the resist 11 is exposed and developed so that an opening is formed at a position corresponding to the electrode pad 3 on the first face. The resist 11 serves as a mask in dry etching for forming a penetrating hole in the semiconductor wafer 1. FIG. 2(a) illustrates this state.

Next, as illustrated in FIG. 2(b), dry etching is performed on the semiconductor wafer 1, using the resist 11 as a mask. When the semiconductor wafer 1 is etched, and accordingly the first insulating film 2 immediately below the electrode pad 3 is exposed, the etching ceases to proceed. After the etching, the resist 11 is removed.

Next, as illustrated in FIG. 2(c), electrodeposition is performed so that the semiconductor wafer 1 is a cathode, and by use of electrodeposition resist, the second insulating film 5 is formed on the inner wall of the penetrating hole and on the second face (back face) of the semiconductor wafer 1. Polyimide or epoxy is useful as a material for the electrodeposition resist. At that time, if the electrode pad 3 is electrically connected with the semiconductor wafer 1 and is exposed to electrodeposition liquid, the electrodeposition resist is also formed on the exposed part of the electrode pad 3. In order to prevent this, it is necessary to cover in advance the front face of the semiconductor wafer 1 by other resist or a protective film, or to use a device having a structure in which the front face of the semiconductor wafer 1 does not touch electrodeposition liquid.

The electrodeposition resist is formed only on a conductive part, namely, on an exposed face of the semiconductor wafer acting as a cathode. As a result, the second insulating film 5 formed through the electrodeposition resist is deposited only on the second face of the semiconductor wafer 1 and on the inner wall of the penetrating hole, and is not deposited on the back face of the first insulating film 2, which is immediately under the electrode pad 3. As a result, unlike in a conventional example, it is unnecessary to carry out a special process such as patterning so as to remove an insulating film on the back face of the first insulating film 2 after the second insulating film 5 is formed, and accordingly it is possible to easily insulate the inner wall of the penetrating hole using the second insulating film 5.

Here, by using commercially available electrodeposition resist solution, electrodeposition is performed so that electrodeposition resist reaches a predetermined thickness, and then cleansing and consolidation of the electrodeposition resist is performed so that the second insulating film 5 is formed. At that time, considering that the thickness becomes small at pinholes in the electrodeposition resist or at the shoulder of the penetrating hole, electrodeposition should be performed so that the thickness of the electrodeposition resist becomes approximately 1.5 μm.

Next, as illustrated in FIG. 3(a), using the second insulating film 5 as a mask, dry etching is performed on the first insulating film 2 immediately below the electrode pad 3, and thereby the back face of the electrode pad 3 is exposed. At that time, it is unnecessary to carry out a special process such as forming a mask for etching the first insulating film 2 on the back face of the electrode pad 3. That is, it is unnecessary to paint resist on the semiconductor wafer 1 having the penetrating hole and then perform patterning, or to form an insulating film by plural applications of CVD. As such, alignment or the like is unnecessary, and therefore it is possible to easily expose the electrode pad 3.

Next, as illustrated in FIG. 3(b), a seed metal layer is formed from the back face of the semiconductor wafer 1 by use of CVD so as to perform electrolytic plating. Methods other than CVD such as sputtering may be used for forming the seed metal layer. Here, it is necessary to form a seed metal layer as far as the back of the penetrating hole, which is deep. As such, the CVD method is selected, which allows satisfactory forming of a film even in a narrow space. As the seed metal layer, for example, TiN whose thickness is 0.1 μm and Cu whose thickness is 0.5 μm are formed.

Next, the conductor layer 6 which becomes a rewiring pattern for electrically connecting the back face of the electrode pad 3 and the later-formed external input/output terminal 7 is formed on the seed metal layer through electrolytic copper plating or the like. For this purpose, resist 12 is painted on the back face of the semiconductor wafer 1, and then the rewiring pattern is formed in the resist 12 through a general photolithographic process such as exposure and development. When it is difficult to paint liquid resist on the semiconductor wafer 1 having the penetrating hole, dry film resist or the like may be used as the resist 12.

Next, by performing electrolytic copper plating using the seed metal layer as a cathode, the thickness of the rewiring pattern on the opened part of the resist 12 is increased and the rewiring pattern becomes the conductor layer 6. Because a solder ball is mounted as the external input/output terminal 7 on the conductor layer 6 in a later step, the thickness of the conductor layer 6 is set as 10 μm.

Next, as illustrated in FIG. 3(c), the resist 12 is removed and the unnecessary seed metal layer is removed through etching. Further, the protective film 8 is formed on the whole area of the back face of the semiconductor wafer 1 using photosensitive insulating resin. A part of the protective film 8 where the external input/output terminal 7 is to be formed is opened through a photolithographic process such as exposure and development. Further, the solder ball provided as the external input/output terminal 7 is mounted on the opened part of the protective film 8, and the semiconductor wafer 1 is diced into individual semiconductor chips, so that the semiconductor device illustrated in FIG. 1 is completed.

Figure 4:
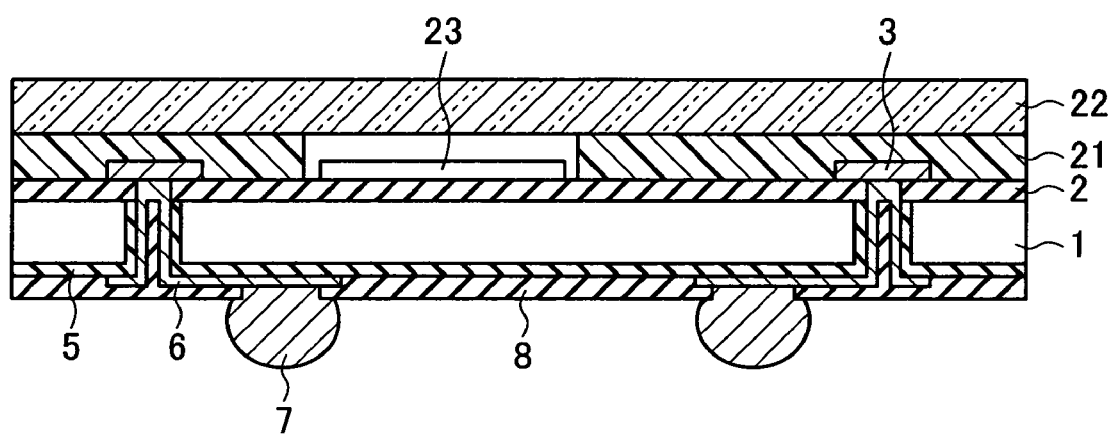
FIG. 4 is a cross sectional view illustrating a main structure of a CCD package using the semiconductor device.
Figure 5:
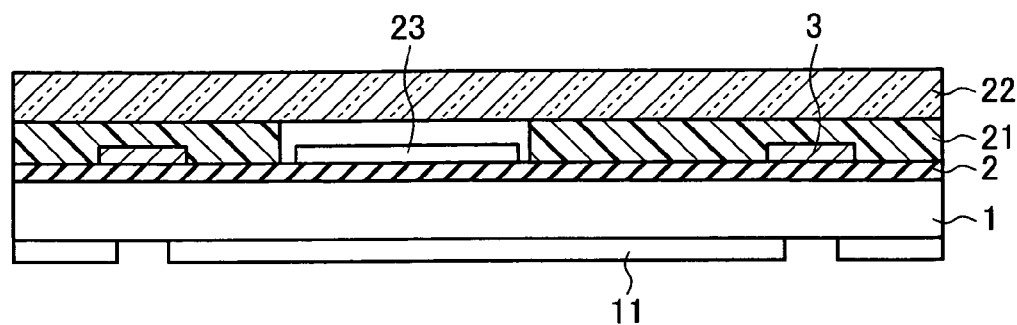
FIGS. 5(a) through 5(c) are cross sectional views illustrating a part of a process for fabricating the CCD package.
Figure 5:
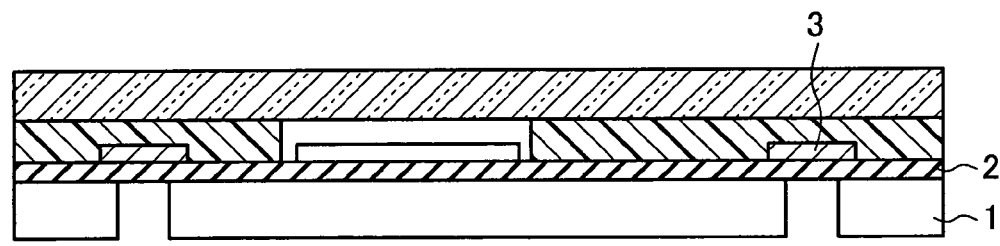
Figure 5:
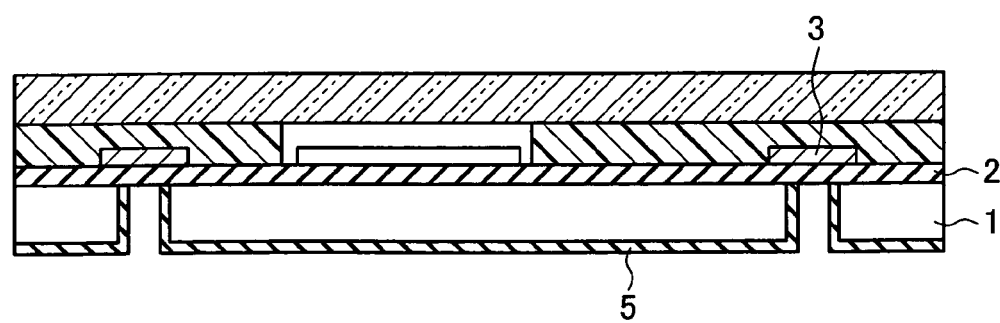
Figure 6:
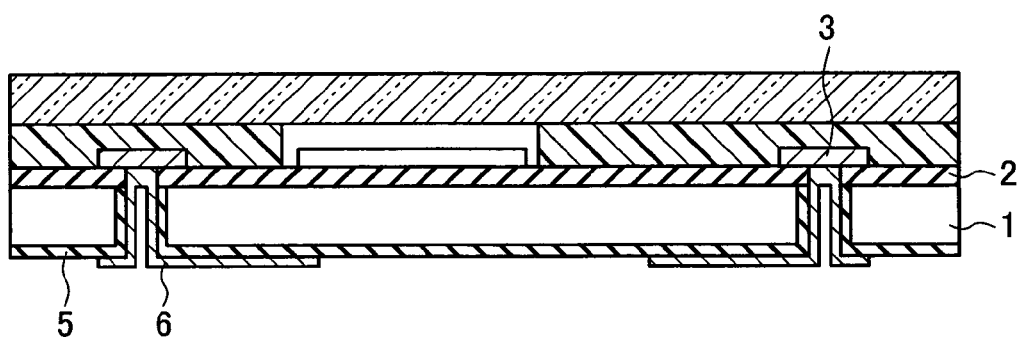
FIGS. 6(a) and 6(b) are cross sectional views illustrating a part of a process for fabricating the CCD package.
Figure 6:
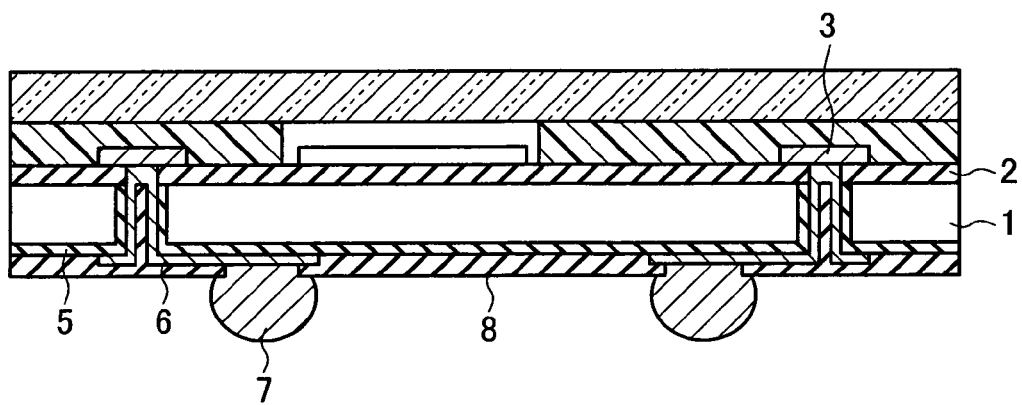

Next, an example of a structure of a CCD (Charge Coupled Device) package made of a semiconductor device having a penetrating electrode according to the present invention is explained below, with reference to FIG. 4. Note that in FIG. 4, parts having the same structures and functions as those of the semiconductor device illustrated in FIG. 1 are given the same numbers in the following explanation.

In the CCD package illustrated in FIG. 4, the penetrating hole is formed immediately below the electrode pad 3 formed on the first face of the semiconductor wafer 1. The electrode pad 3 formed on the first face of the semiconductor wafer 1 and the external input/output terminal 7 formed on the second face of the semiconductor wafer 1 are connected with each other through the conductor layer 6 made by copper plating.

At that time, the electrode pad 3 and the conductor layer 6 are electrically insulated from the semiconductor wafer 1. Namely, the insulation is maintained by the first insulating film 2 formed on the first face of the semiconductor wafer 1 and by the second insulating film 5 formed on the inner wall of the penetrating hole and on the second face of the semiconductor wafer 1.

Further, a glass plate 22 is adhered to the first face of the semiconductor wafer 1 by using an adhesive 21. The adhesive 21 is formed in such a manner that the adhesive 21 avoids a CCD sensor part 23 formed on the first face of the semiconductor wafer 1.

A process for forming the CCD package is explained below with reference to FIGS. 5(a) through 5(c) and FIGS. 6(a) and 6(b).

First, as illustrated in FIG. 5(a), a layer of the adhesive 21 is formed on the first face of the semiconductor wafer 1, which first face has the first insulating film 2 and the electrode pad 3 and on which first face the metallic wire layer and the CCD sensor part 23 are formed. The adhesive 21 is formed in such a manner that the adhesive 21 avoids a region on which the CCD sensor part 23 is formed. The reason is that when the adhesive 21 is formed on the CCD sensor part 23, the CCD sensor part 23 optically deteriorates. The adhesive 21 is formed on the semiconductor wafer 1 through known means such as dispensing or printing methods. Further, according to circumstances, the adhesive 21 may be formed on the glass plate 22 to be affixed to the semiconductor wafer 1.

In order to protect the CCD sensor part 23 including a micro-lens and the like, the glass plate 22 is affixed to the semiconductor wafer 1 by using the adhesive 21 which is formed to have a predetermined thickness. This glass plate 22 is used for protection of the CCD sensor part 23 and reinforcement of the semiconductor wafer 1 which is made thin. In this case, a glass plate 22 having a thickness of 0.5 mm is used.

Next, the back face of the semiconductor wafer 1 is polished so that the thickness of the semiconductor wafer 1 becomes 100 μm. The reason is that by causing the semiconductor wafer 1 to be as thin as possible, the thickness of the CCD package is made small. Note that the region on which the CCD sensor part 23 is formed has a vacant space because the adhesive 21 is not formed on that region. Polishing the back face of the semiconductor wafer 1 having such a vacant space may cause the semiconductor wafer 1 to break. Of course, it is possible to polish the semiconductor wafer 1 in advance to have a thickness of 100 μm through a back face polishing method, and affix the semiconductor wafer 1 to the glass plate 22 on which the adhesive 21 is formed. As a result, the problem is solved.

Next, the resist 11 is painted on the polished back face of the semiconductor wafer 1, and the resist 11 is exposed and developed so that the position corresponding to the electrode pad 3 on the first face is opened. The resist 11 serves as a mask when dry etching is performed on the semiconductor wafer 1. FIG. 5(a) illustrates this state.

Next, as illustrated in FIG. 5(b), dry etching is performed on the semiconductor wafer 1, using the resist 11 as a mask. When the semiconductor wafer 1 is etched and the first insulating film 2 immediately below the electrode pad 3 is exposed, the etching ceases to proceed. After the etching, the resist 11 is removed.

Next, as illustrated in FIG. 5(c), electrodeposition is performed using the semiconductor wafer 1 as a cathode, and the second insulating film 5 is formed on the inner wall of the penetrating hole in the semiconductor wafer 1 and on the second face (back face) of the semiconductor wafer 1 using electrodeposition resist (for example, electrodeposition polymide). The second insulating film 5 illustrated in FIG. 5(c) can be obtained by performing electrodeposition so that the electrodeposition resist has a predetermined thickness, and then cleansing and consolidating the electrodeposition resist. In this case, electrodeposition is performed so that the thickness becomes 10 μm, considering that the thickness becomes small at pinholes in the electrodeposition resist or at a shoulder of the Si hole.

Because the second insulating film 5 made of electrodeposition resist is formed only on the exposed face of the semiconductor wafer 1 acting as a cathode, it is possible to easily insulate the inner wall of the semiconductor wafer 1, without alignment or patterning.

Next, as illustrated in FIG. 6(a), dry etching is performed on the first insulating film 2 immediately below the electrode pad 3, using the second insulating film 5 as a mask, and the back face of the electrode pad 3 is exposed. In this way, the oxide film (the first insulating film 2) is etched by dry etching, using electrodeposition resist as a mask, and therefore a further process for forming a special mask is not necessary.

Next, the seed metal layer for electrolytic plating is formed by sputtering from the back face of the semiconductor wafer 1. Of course, the seed metal layer may be formed by a method other than sputtering, such as deposition or CVD. In the present case, inverse sputtering is performed for 5 minutes at a power of 0.5 kw, and then Ti is sputtered so as to have a thickness of 0.1 μm and Cu is sputtered so as to have a thickness of 0.5 μm. Under these conditions, it was verified that a metallic layer having a thickness of approximately 0.2 through 0.3 μm is formed on the inner wall of the penetrating hole in the semiconductor wafer 1.

Next, the conductor layer 6 provided as the rewiring pattern for electrically connecting the back face of the electrode pad 3 and the external input/output terminal 7 is formed through electrolytic copper plating. For this purpose, firstly, resist is painted on the back face of the semiconductor wafer 1. When it is difficult to paint liquid resist on the semiconductor wafer 1 having a hole, dry film resist or the like may be used. In the resist, the rewiring pattern is formed through general photo steps such as exposure and development, and electrolytic copper plating is performed using the seed metal layer as a cathode, and thereby the conductor layer 6 is formed. Because the solder ball is mounted as an input/output terminal on the conductor layer 6 in a later step, the thickness of the conductor layer 6 was set to 10 μm. After electrolytic plating, the resist is removed and the unnecessary seed metal layer is removed through etching, and thereby the state illustrated in FIG. 6(a) is obtained.

The conductor layer 6 provided as the rewiring pattern may be formed using a method other than electrolytic plating, such as a method for forming a wiring by pattern printing of conductive paste, or a method for forming a metal through deposition or sputtering and performing pattern etching of the metal. For example, the conductor layer 6 can be formed by sputtering Ti to have a thickness of 0.2 μm and CuNi alloy to have a thickness of 0.6 μm, forming a resist pattern, and then performing wet etching of the resist pattern.

Next, photosensitive insulating resin is painted on the whole area of the back face of the semiconductor wafer 1 and the region on which the solder ball is to be mounted is opened, and thereby the protective film 8 is formed. Further, the solder ball provided as the external input/output terminal 7 is mounted on the opened region, and the semiconductor wafer 1 is diced into individual semiconductor chips, so that the CCD package illustrated in FIG. 4 is completed.

As described above, the semiconductor device according to the present embodiment uses electrodeposition resist in forming the second insulating film 5 for insulating the inner wall of the penetrating hole in the semiconductor wafer 1 and the second face of the semiconductor wafer 1. As a result, the structural relation between the first insulating film 2 and the second insulating film 5 of the semiconductor device illustrated in FIG. 1 is somewhat different from the structural relation between the first insulating film 102 and the second insulating film 105 of the conventional structure illustrated in FIG. 9.

That is, according to the structure of the present invention illustrated in FIG. 1, in the first insulating film 2 immediately below the electrode pad 3, the side face of the opened part, made by etching, is exposed at the inner wall of the penetrating hole included in the semiconductor wafer 1. The reason is that, as described above, after the second insulating film 5 is formed through electrodeposition, etching is performed on the first insulating film 2, using the second insulating film 5 itself as a mask.

Figure 9:
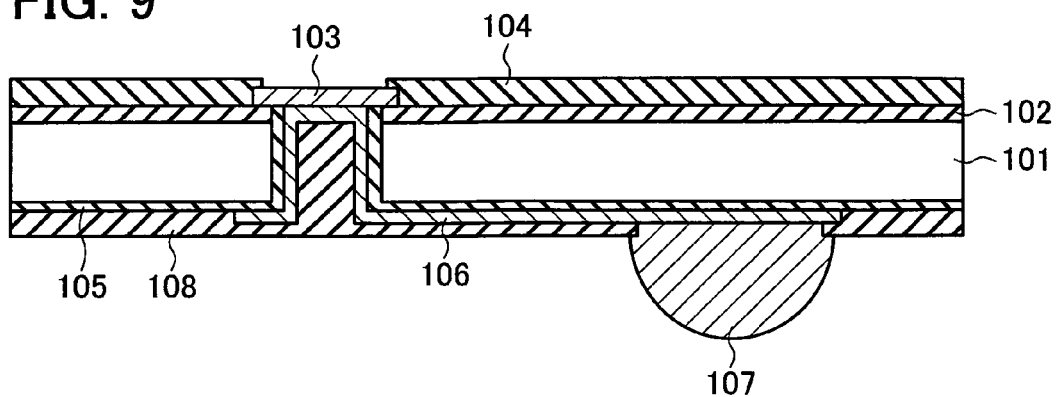
FIG. 9 is a cross sectional view illustrating a main structure of a conventional semiconductor device.
Figure 10:
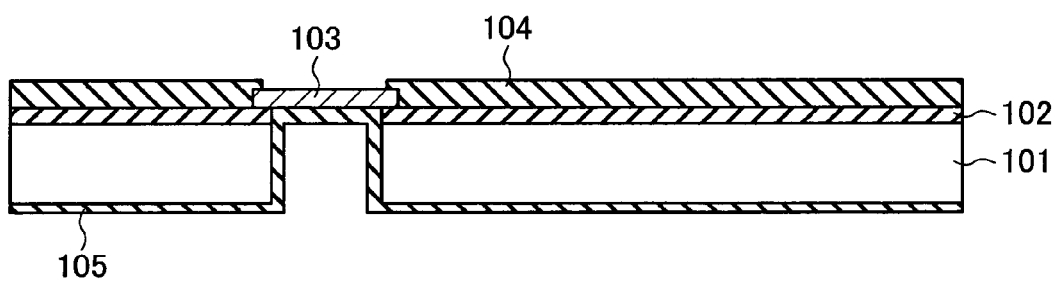
FIGS. 10(a) and 10(b) are cross sectional views illustrating a process for fabricating a second insulating film in a conventional semiconductor device.
Figure 10:
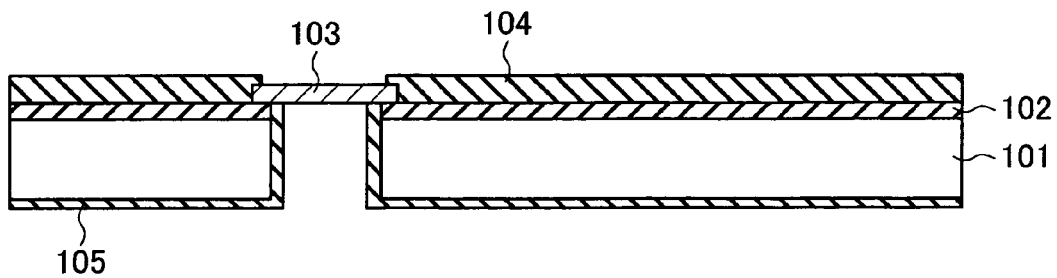

On the other hand, according to the conventional structure illustrated in FIG. 9, only the second insulating film 105 is exposed at the inner wall of the penetrating hole included in the semiconductor wafer 101. The reason is that the semiconductor wafer 101 and the first insulating film 102 are etched and a penetrating hole that reaches the back face of the electrode pad 103 is formed, and then the second insulating film 105 is formed.

A variety of points of difference between the present invention and the conventional structure due to such differences in structure are explained below.

Figure 7:
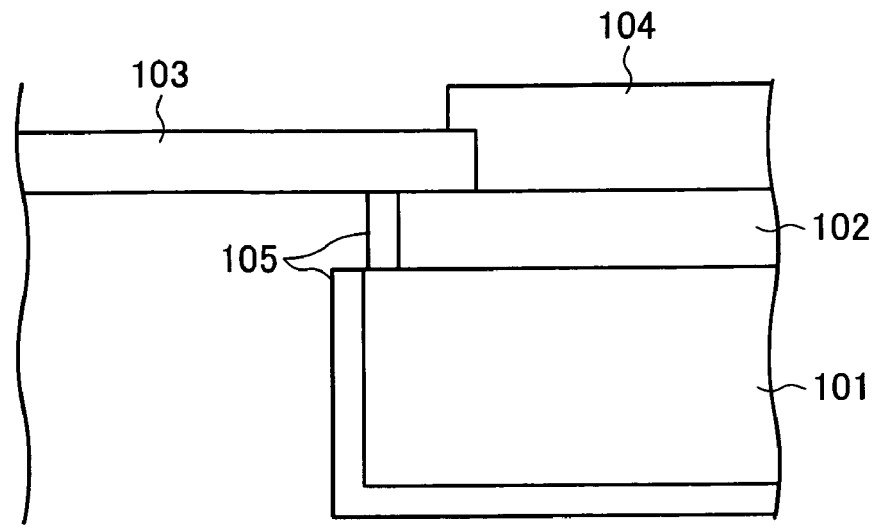
FIG. 7(a) is a cross sectional view illustrating one example of a forming condition of a first insulating film and a second insulating film in a conventional semiconductor device.
FIG. 7(b) is a cross sectional view illustrating one example of a forming condition of a first insulating film and a second insulating film in a semiconductor device of the present invention.
Figure 7:
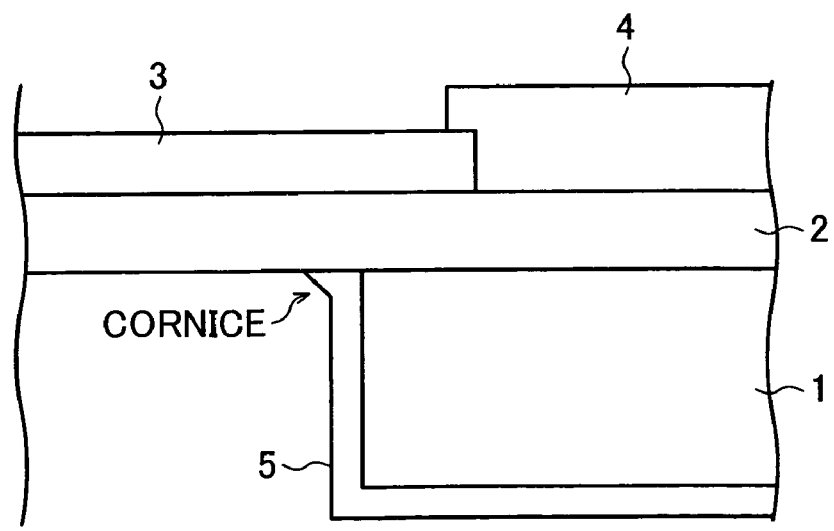

FIG. 7(*a*) is a figure illustrating a forming condition of the first insulating film 102 and the second insulating film 105 inside the penetrating hole of the semiconductor wafer 101 in the conventional structure.

In the conventional structure, the penetrating hole is firstly formed in the semiconductor wafer 101, and using the semiconductor wafer 101 as a mask, the first insulating film 102 is etched. In etching of the first insulating film 102, side etching proceeds in the first insulating film 102, and an overhang part is generated.

When the second insulating film 105 is formed from the bottom through CVD or the like, while the overhang part is generated, the second insulating film 105 becomes thin at the overhang part, and in some cases disjoint. Therefore, there is a possibility of leakage. Further, when unevenness remains due to the overhang part, coverage deteriorates in forming the metallic film in a later step, and thereby the metallic layer may be disjoint. Of course, the amount of overhang or the thickness of the second insulating film 105 changes the probability of generation of such defects, but such defects may cause a problem.

The defect can be avoided by using a second insulating film 105 having a large thickness. However, for example, in order to form an insulating film whose minimum thickness is not less than 0.5 μm and to compensate for an overhang of 0.5 μm, it is necessary to make the thickness approximately 1 through 5 μm in an upper part of the semiconductor wafer 101 (bottom face in the penetrating hole). However, making the thickness large increases costs.

Further, in a later step, it is necessary to remove, by etching, the second insulating film 105 formed immediately below the electrode pad 103. Therefore, when the second insulating film 105 is needlessly thick, the etching takes much time, which increases costs.

On the other hand, FIG. 7(*b*) is a figure illustrating a forming condition of the first insulating film 2 and the second insulating film 5 inside the penetrating hole of the semiconductor wafer 1 in the structure of the present invention.

When the second insulating film 5 is formed through electrodeposition in the present invention, the film is evenly formed on the inner wall of the penetrating hole of the semiconductor wafer 1 and on the second face (back face) of the semiconductor wafer 1. Further, in this case, it is easy to form an insulating film having a thickness of approximately 10 μm.

Further, as illustrated in FIG. 7(*b*), after electrodeposition, the second insulating film 5 has a cornice at a region where the second insulating film 5 contacts the first insulating film 2. This cornice serves as a mask for the first insulating film 2, and has an effect of preventing side etching of the first insulating film 2. Because of these points, the structure of the present invention has such advantages that leakage or defective coverage due to side etching of the first insulating film 2 is reduced.

Figure 8:
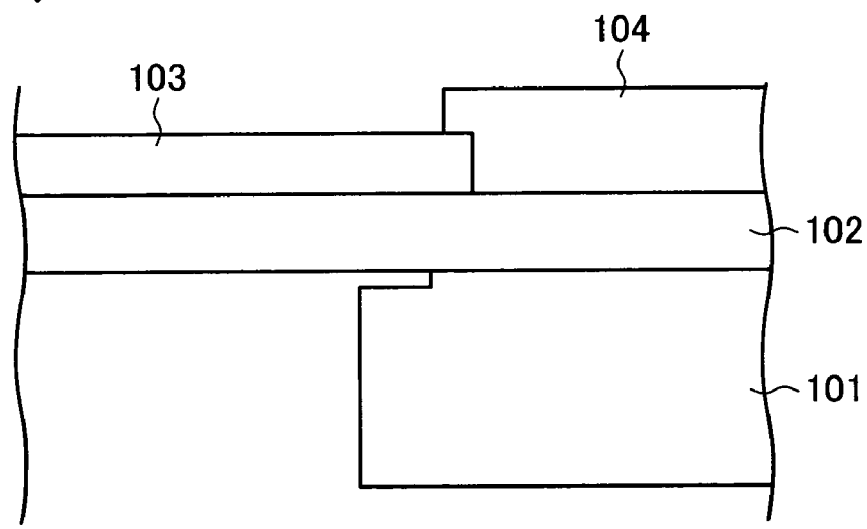
FIG. 8(a) is a cross sectional view illustrating a state immediately after a penetrating hole of a semiconductor wafer has been formed in a process for fabricating a conventional semiconductor device.
FIG. 8(b) is a cross sectional view illustrating a forming condition of a second insulating film in a process for fabricating a conventional semiconductor device.
Figure 8:
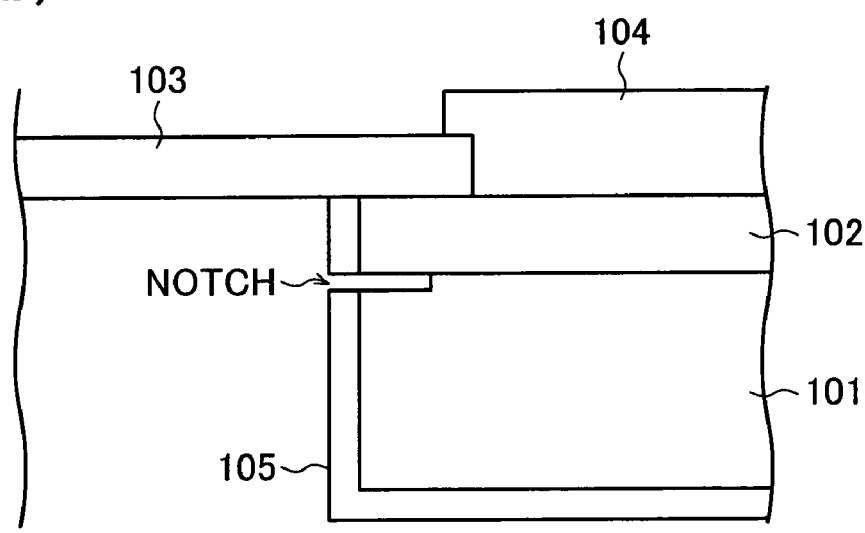

Further, as illustrated in FIG. 8(*a*), in the conventional structure, when dry etching is performed on the semiconductor wafer 101 and the penetrating hole is formed, a phenomenon occurs in which the etching reaches the first insulating film 102 and then the etching proceeds in a lateral direction, with a result that a notch is generated. This notch can be made small by reducing the etching rate, but in this case, the process time is increased and productivity decreases.

In a case where the notch is generated between the semiconductor wafer 101 and the first insulating film 102, when the second insulating film 105 is formed through CVD or the like, the second insulating film 105 is not sufficiently formed at the notch part as illustrated in FIG. 8(*b*), and in some cases leakage may occur.

In the structure of the present invention, as with in the conventional structure, there is a possibility that a notch may be generated between the semiconductor wafer 1 and the first insulating film 2 when dry etching is performed on the semiconductor wafer 1 and the penetrating hole is formed. However, in the present invention, even when a notch is generated, the second insulating film 5 is deposited on the exposed face of the semiconductor wafer 1 during formation of the second insulating film 5 through electrodeposition.

Namely, in the structure of the present invention, even when a notch is generated, the exposed face of the first insulating film 2 and the exposed face of the second insulating film 5 contact with each other at the notch part of the inner wall of the penetrating hole, and the contact part is satisfactorily insulated, so that there is no possibility of leakage.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:

an electrode pad formed on a first face of a semiconductor substrate via a first insulating film; and a penetrating electrode which connects the electrode pad and an external connection terminal on a second face of the semiconductor substrate, wherein a penetrating hole is formed in the semiconductor substrate having the first insulating film and the electrode pad formed on the first face thereof, the penetrating hole being immediately below the electrode pad, a second insulating film is formed of an inner wall of the penetrating hole and on the second face of the semiconductor substrate, the first insulating film immediately below the electrode pad is opened so as to expose a back face of the electrode pad to a second face side of the semiconductor substrate, and a side face of an opening part of the first insulating film is exposed at the inner wall of the penetrating hole; and wherein said second insulating film is integrally formed and of the same material on both the inner wall of the penetrating hole and the second face of the semiconductor substrate.

2. The semiconductor device as set forth in claim 1, wherein a reinforcing plate for preventing breakage of the semiconductor substrate is affixed to the first face of the semiconductor substrate via an adhesive layer.

3. The semiconductor device as set forth in claim 2, said semiconductor device being a solid-state image sensor, wherein the reinforcing plate is made of a light transmitting material and a CCD sensor is disposed between the semiconductor substrate and the reinforcing plate.

* * * * *